United States Patent [19]

Yee

[11] Patent Number: 4,931,665

[45] Date of Patent: Jun. 5, 1990

[54] MASTER SLAVE VOLTAGE REFERENCE CIRCUIT

[75] Inventor: Loren W. Yee, Milpitas, Calif.

[73] Assignee: National Semiconductor corporation, Santa Clara, Calif.

[21] Appl. No.: 436,940

[22] Filed: Nov. 14, 1989

Related U.S. Application Data

[63] Continuation of Ser. No. 181,014, Apr. 13, 1988, abandoned.

[51] Int. Cl.$^5$ ................. H03K 3/01; H03K 19/086
[52] U.S. Cl. .................... 307/296.6; 307/455
[58] Field of Search ................. 307/475, 296.6, 455

[56] References Cited

U.S. PATENT DOCUMENTS

| | | | |
|---|---|---|---|
| 4,459,540 | 7/1984 | Hayashi | 323/314 |
| 4,547,881 | 10/1985 | Varadarajan | 307/296 R |
| 4,623,802 | 11/1986 | Cline et al. | 307/455 |
| 4,644,249 | 2/1987 | Chang | 323/223 |
| 4,678,935 | 7/1987 | Nawata et al. | 307/455 |

FOREIGN PATENT DOCUMENTS

0219937A2  4/1987  European Pat. Off. .
WO83/00397  2/1983  PCT Int'l Appl. .

Primary Examiner—Stanley D. Miller
Assistant Examiner—Richard Roseen
Attorney, Agent, or Firm—Lee Patch; Robert C. Colwell; Paul C. Haughey

[57] ABSTRACT

A circuit for providing a voltage reference level using a master circuit and a plurality of slave circuits. The master circuit includes a $V_{bb}$ reference circuit, a temperature compensation and $V_{cse}$ reference circuit, and a voltage step-up and buffering circuit. Each of the slave circuits has a pair of transistors in an emitter-follower configuration to step down the voltage and drive the circuitry requiring the voltage reference.

5 Claims, 3 Drawing Sheets

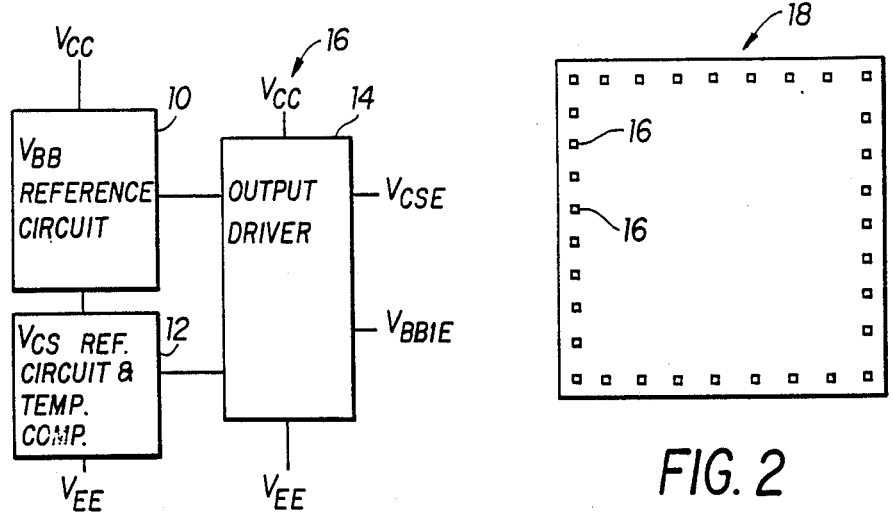
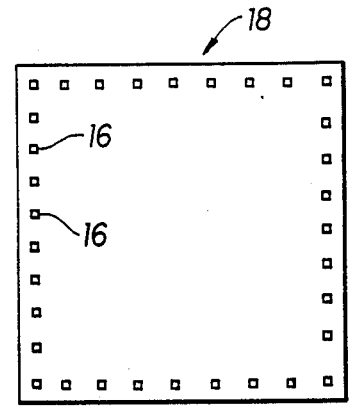
FIG. 1
FIG. 2
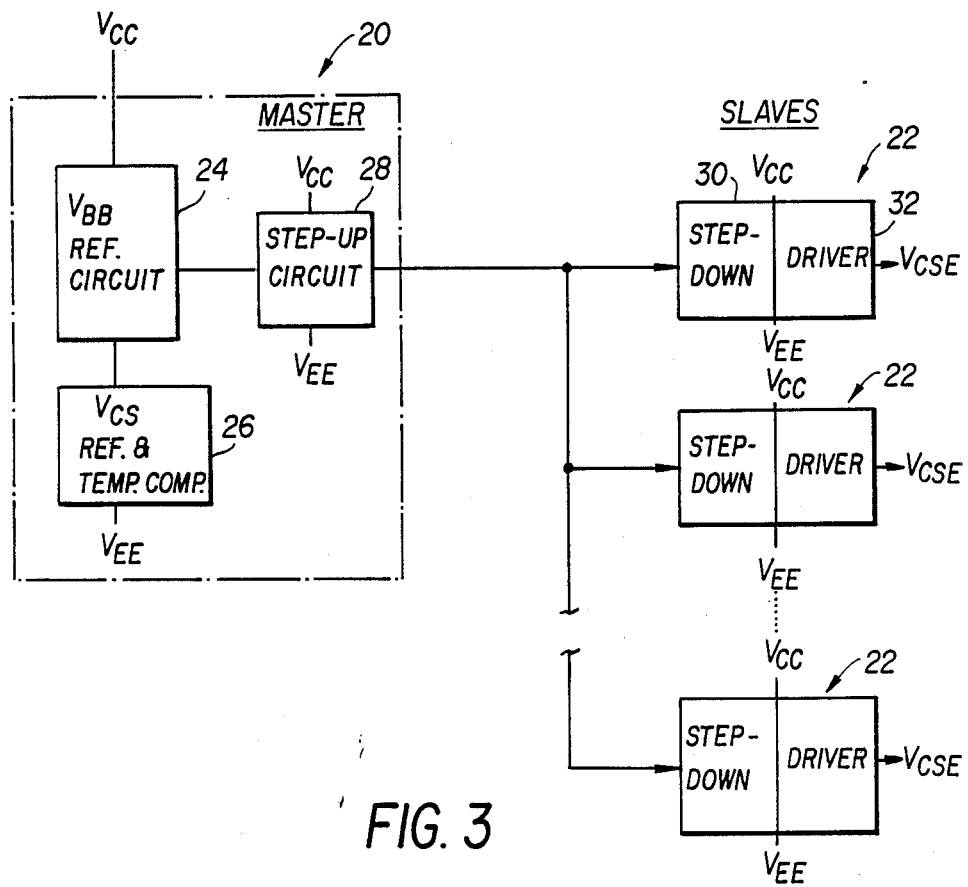
FIG. 3

MASTER SLAVE VOLTAGE REFERENCE CIRCUIT

This is a Continuation of application Ser. No. 181,014, filed Apr. 13, 1988, now abandoned.

BACKGROUND

The present invention relates to circuits for providing voltage reference levels to the ECL (Emitter-Coupled Logic) circuitry of a semiconductor chip.

A typical system for providing a reference voltage level is shown in FIG. 1. A $V_{bb}$ reference circuit 10 is coupled to a fixed supply voltage, $V_{cc}$. A temperature compensation and $V_{cse}$ reference circuit 12 is also coupled to this $V_{bb}$ reference circuit. An output driver circuit 14 provides a step down function to the desired voltage level, $V_{cse}$ and $V_{bble}$, as a voltage reference where needed. Elements 10, 12 and 14 form a intermediate voltage reference circuit 16.

Typically, a plurality of voltage reference circuits 16 are arranged around the edges of a semiconductor chip 18 as shown in FIG. 2. Each of these circuits 16 reproduces the reference voltage level for supplying reference levels to designated I/0 (Input/Output) circuits.

SUMMARY OF THE INVENTION

The present invention provides a circuit for providing a voltage reference level using a master circuit and a plurality of slave circuits. The master circuit includes a $V_{bb}$ reference circuit, a temperature compensation and $V_{cse}$ reference circuit, and a voltage step-up and buffering circuit. Each of the slave circuits has a pair of transistors in an emitter-follower configuration to step down the voltage and drive the circuitry requiring the voltage reference.

By using a master circuit and a plurality of slave circuits, the amount of circuitry and power dissipation required to generate each voltage reference level is reduced. This is done by providing the $V_{bb}$ reference circuit, $V_{cs}$ reference circuit and temperature compensation only once in the master circuit, with the output circuit only needing the driver. In addition, the master is provided with a step-up and buffer circuit and the slaves are provided with a step-down circuit as part of the driver. Because the slave uses an emitter-follower configuration to provide the necessary current, the extra transistor voltage drop must be compensated for with the step-up transistor configuration of the master circuit.

The master circuit of the present invention can either be provided on a chip or externally from the chip, with each chip having a large number of slave circuits arranged around its edges. Thus, the circuitry required on a particular semiconductor chip is much reduced from that of the prior art.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a block diagram of a prior art circuit for generating an intermediate voltage reference;

FIG. 2 is a diagram of a prior art semiconductor chip with a number of circuits as shown in FIG. 1 arranged around its perimeter;

FIG. 3 is a block diagram of a master-slave circuit for producing an intermediate voltage reference according to the present invention;

DETAILED DESCRIPTION OF THE PREFERRED EMBODIMENTS

Figure 4:
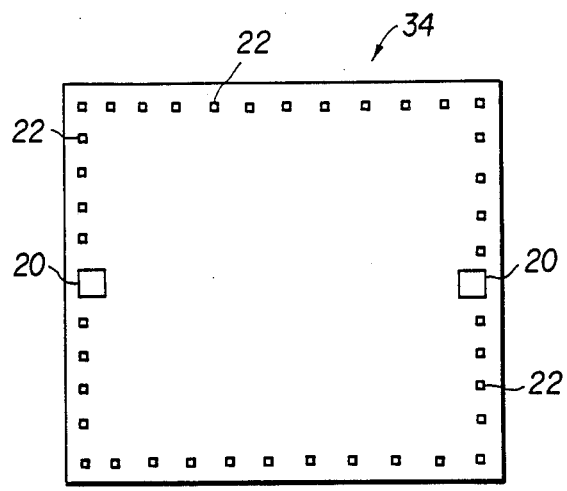
FIG. 4 is a diagram of a semiconductor chip showing the arrangement of the master and slave circuits of FIG. 3.

FIG. 3 is a block diagram of the present invention showing a master circuit 20 and a plurality of slave circuits 22. The master circuit includes a $V_{bb}$ reference circuit 24, a $V_{cs}$ reference circuit and temperature compensation circuit 26 and a step-up and buffer circuit 28. Each of the slave circuits has a step-down transistor 30 and a driver transistor 32. The step-down transistor also acts as a driver in an emitter-follower configuration with driver 32.

FIG. 4 shows the arrangement of the circuit of the present invention on a semiconductor chip 34. A pair of master circuits 20 are shown on two sides of the chip, with a large number of slave circuits 22 arranged around the edges. As can be seen by comparison to FIG. 2, the slave circuits take up much less room than the prior art circuit which included all of the elements in one circuit. Typically, one master circuit may be used for 90 slave circuits, with each slave circuit driving 35 logic cells.

Figure 5:
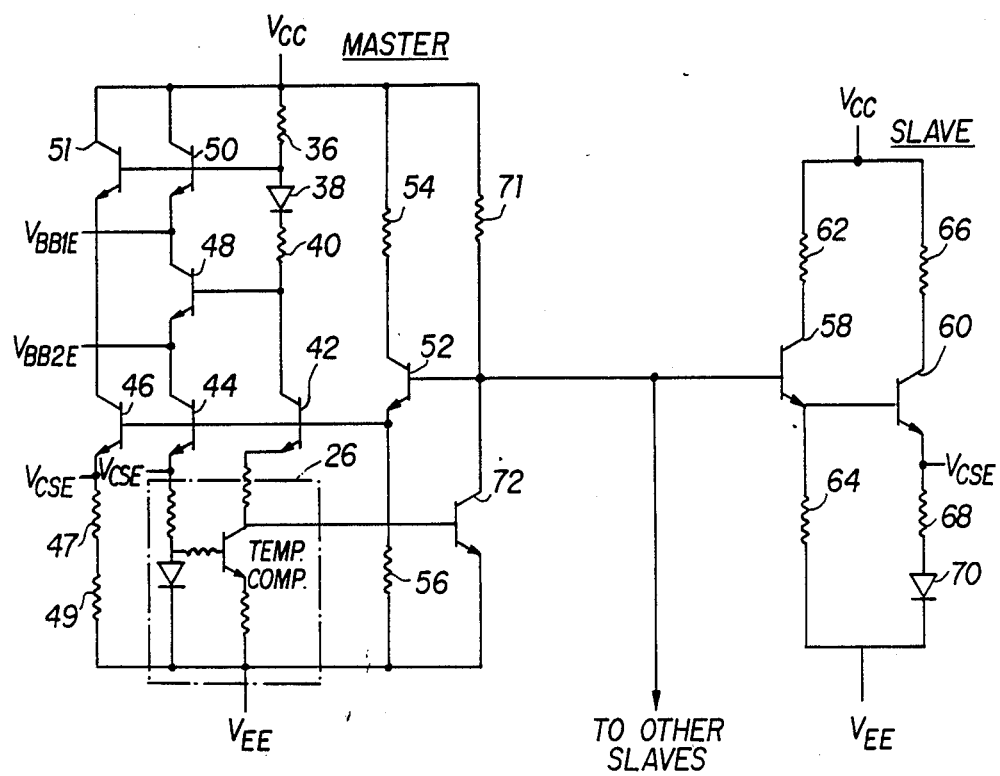
FIG. 5 is a schematic diagram of an external master-slave circuit according to FIG. 3.

FIG. 5 shows one embodiment of the present invention in which the master circuit may be located internally to the chip which contains the slave circuits. A $V_{bb}$ reference circuit is provided through resistor 36, diode 38 and resistor 40. The current from this $V_{bb}$ reference circuit is provided to a transistor 42 which has its emitter coupled to a temperature compensation circuit 26. The base of transistor 42 is also coupled to transistors 44 and 46 which provide a $V_{cse}$ voltage reference at their emitters. A pair of transistors 48 and 50 provide level shifting to $V_{bble}$ and $V_{bb2e}$, respectively. The current through resistor 36, diode 38 and resistor 40 essentially sets up the $V_{bble}$ and $V_{bb2e}$ levels and is generated from the $V_{cs}$ reference circuit. The present invention shifts up the voltage at the base of transistors 42, 44 and 46 by one diode level by the addition of a transistor 52. Transistor 52 is coupled to $V_{cc}$ through resistor 54 and to $V_{ee}$ through a resistor 56, which provides a level shifting function. The base of transistor 52 is coupled to the base of a transistor 58 in each slave circuit.

Each transistor 58 provides a beta drop down to the level of transistor 42 at the base of a output transistor 60. In addition, resistors 62 and 64 are coupled to transistor 58 to provide a match to resistors 54 and 56 of transistor 52 to provide the same current density and cancel temperature effects.

Transistor 52 not only steps up the voltage by one diode level, but also buffers out the temperature and beta effects of transistors 42, 44 and 46. Transistor 58 not only steps the voltage back down, but provides the current needed by output transistor 60, thus reducing the current needed to be produced from the master circuit to the base of transistor 58.

A resistor 66 coupled to output transistor 60 is provided to prevent collector-emitter breakdown. A resistor 68 and a diode 70 are coupled between the emitter of transistor 60 and $V_{ee}$.

The base of transistor 52 is coupled to the collector of transistor 72 and level shifts the collector of transistor 72 to a voltage two $V_{be}$ ($\phi$) above $V_{cse}$ as a result of the voltage drop from the base to the emitter of transistors 46 and 52. Transistors 58 and 60 in each slave circuit shift the voltage down two $\phi$ to recreate voltage $V_{cse}$.

Figure 6:
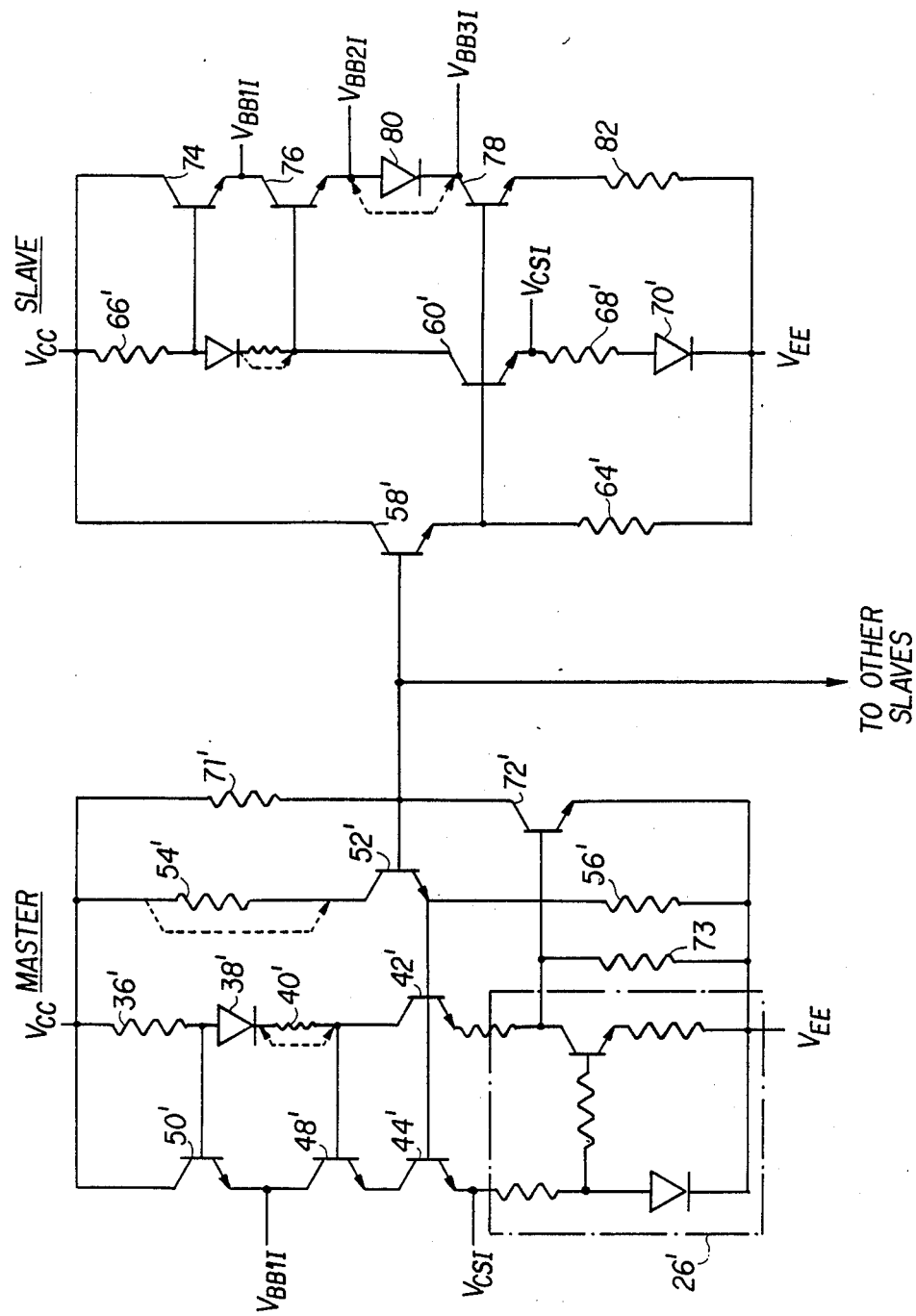
FIG. 6 is a schematic diagram of an internal master-slave circuit according to FIG. 3 for a master circuit contained on a chip.

Transistors 51 and 46 and resistors 47 and 49 provide extra drive capability, and could be eliminated where not needed, as shown in FIG. 6.

FIG. 6 shows an alternate embodiment of the present invention intended for use where the master circuit is on the same semiconductor chip as the slave circuits. The elements shown with a prime symbol (i.e., 54′) correspond to the same element in FIG. 5 (i.e., 54). The primary difference is the addition of a third leg to the slave circuit having transistors 74, 76 and 78 along with optional diode 80 and resistor 82. This circuit allows the slave circuit to produce two or three higher voltage reference level signals. An extra resistor 73 has been added in the master circuit to adjust the temperature compensation from the 100K bias driver shown in FIG. 5 to a 10K bias driver shown in FIG. 6.

As will be understood by those familiar with the art, the present invention may be embodied in other specific forms without departing from the spirit or sense of characteristics thereof. However, this configuration would be beta sensitive. Accordingly, the disclosure of the preferred embodiments of the invention is intended to be illustrative, but not limiting, of the scope of the invention which is set forth in the following claims.

What is claimed is:

1. A circuit for producing a reference voltage level from a supply voltage, comprising:
   a master circuit including
   a circuit for producing a $V_{cs}$ reference voltage,
   means, coupled to said $V_{cs}$ reference circuit, for producing a first voltage larger than said reference voltage by the base-emitter voltage drop of a transistor in said means for producing,
   step-up means, coupled to said means for producing, for producing a second voltage larger than said first voltage by the base-emitter voltage drop of a transistor in said step-up means; and
   a plurality of slave circuit coupled to said master circuit, each said slave circuit including first and second transistors coupled in an emitter-follower configuration in cascade with the emitter of said first transistor coupled to the base of said second transistor.

2. The circuit of claim 1 wherein said master circuit further comprises a temperature compensation circuit coupled to said $V_{cs}$ reference circuit.

3. The circuit of claim 1 wherein said $V_{cs}$ reference circuit includes a first transistor and said step means includes a second transistor having its emitter coupled to a base of said first transistor and a base of said second transistor being coupled to a base of a first one of said emitter-follower transistors in each of said slave circuits.

4. A circuit for producing a reference voltage level form a supply voltage, comprising:
   a master circuit including
   a circuit for producing a Vcs reference voltage, including a resistor and a diode coupled to a supply voltage,
   means, coupled to said $V_{cs}$ reference circuit, for producing a first voltage larger than said reference voltage by the base-emitter voltage drop of a transistor in said means for producing,
   step-up means, coupled to said means for producing, for producing a second voltage larger than said first voltage by the base-emitter voltage drop of a transistor in said step-up means; and
   a plurality of slave circuits coupled to said master circuit, each said slave circuit including first and second transistors coupled in an emitter-follower configuration with the emitter of said first transistor coupled to the base of said second transistor.

5. A circuit for producing an intermediate voltage level from a supply voltage, comprising:
   a master circuit including
   circuit means for producing a $V_{cs}$ reference voltage having a resistor and a diode coupled to said supply voltage,
   a first transistor having a collector coupled to said $V_{cs}$ reference circuit means,
   a temperature compensation circuit coupled between an emitter of said first transistor and a negative voltage supply,
   a second transistor having an emitter coupled to a base of said first transistor and a collector coupled to said supply voltage; and
   a plurality of slave circuits coupled to said master circuit, each of said slave circuits including
   third and fourth transistors arranged in an emitter-follower configuration with said third transistor having a base coupled to a base of said second transistor, an emitter of said third transistor being coupled to a base of said fourth transistor, an emitter of said fourth transistor being coupled to an output for providing said intermediate voltage level, said third and fourth transistors having collectors coupled to said supply voltage; and
   a resistor and a diode in series coupling said emitter of said fourth transistor to said negative supply voltage.

* * * * *